United States Patent
Moravec et al.

(10) Patent No.: US 9,165,573 B1
(45) Date of Patent: Oct. 20, 2015

(54) METHOD FOR CONTROLLING CAMBER ON AIR BEARING SURFACE OF A SLIDER

(75) Inventors: Mark D. Moravec, Gilroy, CA (US); Chirawat Srisang, Saraburi (TH); Anucha Nontprasat, Pathum Thani (TH)

(73) Assignee: Western Digital (Fremont), LLC, Fremont, CA (US)

( * ) Notice: Subject to any disclaimer, the term of this patent is extended or adjusted under 35 U.S.C. 154(b) by 1092 days.

(21) Appl. No.: 12/617,569

(22) Filed: Nov. 12, 2009

(51) Int. Cl.
| | |
|---|---|
| *G11B 5/31* | (2006.01) |
| *G11B 5/127* | (2006.01) |
| *G11B 5/187* | (2006.01) |
| *H01L 21/78* | (2006.01) |

(52) U.S. Cl.
CPC .............. *G11B 5/3173* (2013.01); *G11B 5/127* (2013.01); *G11B 5/1871* (2013.01); *G11B 5/3106* (2013.01); *G11B 5/3163* (2013.01); *H01L 21/78* (2013.01); *Y10T 29/4905* (2015.01); *Y10T 29/49032* (2015.01); *Y10T 29/49041* (2015.01); *Y10T 29/49048* (2015.01); *Y10T 29/49053* (2015.01); *Y10T 29/49789* (2015.01); *Y10T 29/49798* (2015.01)

(58) Field of Classification Search
CPC .... G11B 5/3173; G11B 5/106; G11B 5/3163; G11B 5/18713; G11B 5/127; G11B 5/3106; G11B 5/1871; H01L 21/78; Y10T 29/49032; Y10T 29/49041; Y10T 29/49048; Y10T 29/4905; Y10T 29/49053; Y10T 29/49789; Y10T 29/49798
USPC ............... 29/603.07, 603.12, 603.16, 603.17, 29/603.19, 412, 417; 438/33, 460, 68, 438/107, 113
See application file for complete search history.

(56) References Cited

U.S. PATENT DOCUMENTS

| | | | |
|---|---|---|---|
| 4,839,300 A * | 6/1989 | Kawahara et al. | ........ 438/107 X |
| 5,117,589 A | 6/1992 | Bischoff et al. | |
| 5,177,860 A * | 1/1993 | Yura et al. | ................. 29/603.07 |
| 5,718,035 A | 2/1998 | Yamanaka et al. | |
| 5,739,048 A | 4/1998 | Kerth et al. | |
| 5,987,725 A | 11/1999 | Church et al. | |
| 6,093,083 A | 7/2000 | Lackey | |
| 6,202,289 B1 | 3/2001 | Yoshimura et al. | |
| 6,354,912 B1 | 3/2002 | Osada et al. | |
| 6,443,813 B1 | 9/2002 | Strom et al. | |
| 6,515,309 B1 * | 2/2003 | Tohyama et al. | ........... 438/68 X |
| 6,531,084 B1 * | 3/2003 | Strom et al. | ........... 29/603.12 X |
| 6,662,069 B1 | 12/2003 | Khlif | |
| 6,663,817 B1 | 12/2003 | Chang et al. | |
| 6,687,976 B1 | 2/2004 | Koyama et al. | |
| 6,733,377 B2 | 5/2004 | Adachi et al. | |
| 6,976,302 B2 | 12/2005 | Itoh et al. | |
| 7,124,497 B1 | 10/2006 | Olim et al. | |
| 7,258,151 B2 | 8/2007 | Nomura et al. | |
| 2003/0005573 A1 | 1/2003 | Shiraishi et al. | |

(Continued)

FOREIGN PATENT DOCUMENTS

JP    2007052868 A  *  3/2007

*Primary Examiner* — A. Dexter Tugbang (57) ABSTRACT

A method of a parting a slider from a slider bar is disclosed. The method includes receiving a slider bar comprising a plurality of sliders and having an air bearing surface (ABS) side and a back side opposite to the ABS side and parting at least one slider from the slider bar with a cutter, wherein the cutter enters the slider bar at least in part on the backside and exits the slider bar at least in part on the ABS side and the ABS side is facing away from the cutting direction by a predetermined acute angle.

3 Claims, 9 Drawing Sheets

(56) References Cited

U.S. PATENT DOCUMENTS

2003/0056628 A1  3/2003  Razon
2007/0105345 A1* 5/2007  Kurosawa .................... 438/460
2007/0119046 A1  5/2007  Seki et al.

* cited by examiner

FIG. 1A

Side View of Slider Along Y axis

METHOD FOR CONTROLLING CAMBER ON AIR BEARING SURFACE OF A SLIDER

FIELD OF THE INVENTION

The present invention generally relates to fabrication of sliders and, in particular, relates to a method and apparatus for controlling camber on air-bearing surface of a slider.

BACKGROUND OF THE INVENTION

In a hard disk drive (HDD), a slider, supported by a suspension arm, "flies" over a surface of a rotating magnetic disk at a high velocity, reading data from and writing data to concentric data tracks on the disk. Currently the areal density of recording magnetic disk drive is rapidly increasing at a CAGR of 40%. The slider fly height continues to be reduced, enabling increased signal strength between the sensor and the media. The curvature profile of the slider air bearing surface (ABS) is a critical parameter for fly height control. For example, it has been found that two important characteristics of the slider to achieve and maintain the desired flying characteristics for the slider are crown and camber.

Figure 1A:
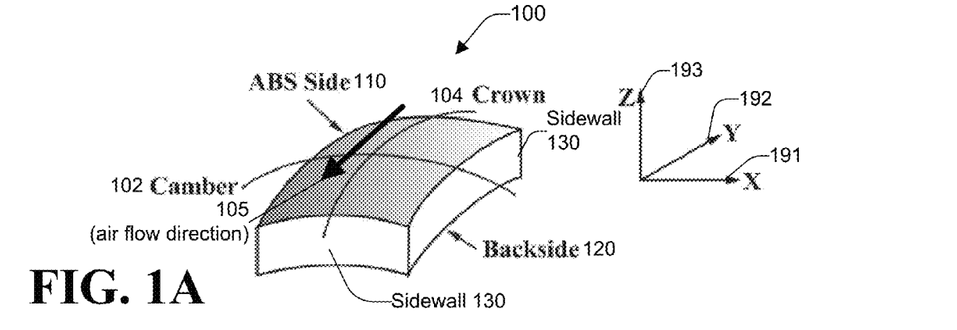
FIG. 1A depicts a slider having a camber and a crown on an ABS side of the slider.
Figure 1B:
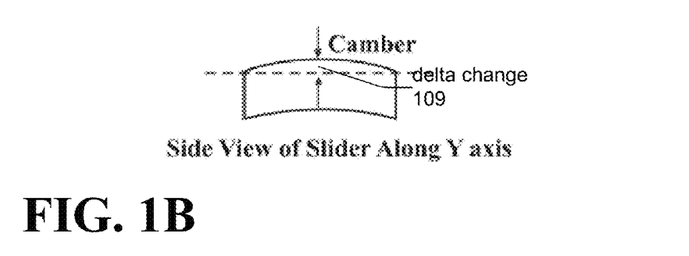
FIG. 1B depicts camber measured in a deviation or a delta change from a planar surface.

FIG. 1A depicts a slider 100 having camber 102 and crown 104 on an ABS side 110 of the slider 100. The slider 100 also has a backside 120 opposite to the ABS side 110 and two substantially parallel sidewalls 130 perpendicular to the ABS side and backside. Crown 104 is along an air flow direction 105, while camber 102 is along a direction perpendicular to the air flow direction 105. As illustrated in FIG. 1B, camber 102 is measured by a deviation or a delta change 109 from a planar surface in a direction perpendicular to the air flow direction 105 with a convex shape (having a positive delta change as shown) defined as positive camber and a concave shape (having a negative delta change) defined as negative camber. Crown 104 is measured by a deviation or delta change (not shown) from a planar surface in the air flow direction 105 with a convex shape (having a positive delta change) defined as positive crown and a concave shape (having a negative delta change) defined as negative crown.

Neither negative camber nor negative crown of the ABS is desirable because this not only leads to variation in the flying height but also makes it more likely that the edges of the slider will damage the spinning media should there be inadvertent contact with the media, caused, e.g., by an operational shock. In this regard, the camber is especially known to impact the reliability of an operating HDD. The ABS surface is as little as 8 nm from the rotating disk. The camber profile impacts the clearance budget as the highest camber point will be the point of closet proximity to the spinning media. During HDD start up and shut down the slider is subjected to load/unload (L/UL) while the media is rotating. Control of the camber is important during L/UL as it can behave much like a knife edge digging into the media creating disk ding and/or disk scratches resulting in lost data or complete drive failure. For these reasons, it is desirable to have a positive crown in a range of between about 0 and 0.4 μ-inch and a positive camber in a range of between about 0 and 0.6 μ-inch.

Conventionally, camber adjustment during the slider fabrication process has utilized several technologies such as: spherically curved lapping plates, back side grinding, diamond-tip scribing, laser scribing, backside lapping, backside reactive ion etching, ion beam etching, and other methods. The aforementioned prior art camber adjustment techniques are performed prior to a slider parting process and manipulate the stresses on the slider backside 120 or on the slider ABS side 110.

Figure 2:
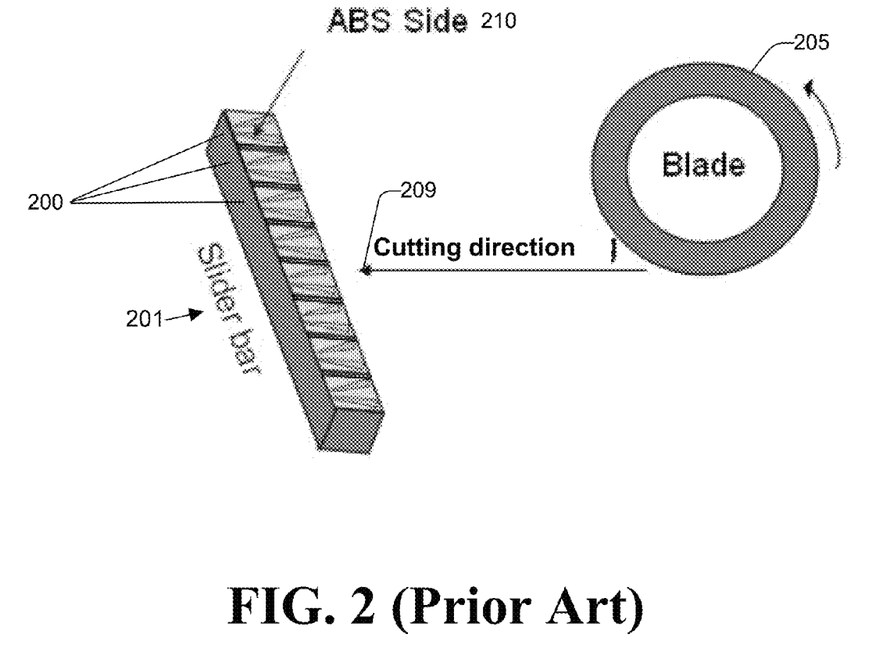
FIG. 2 is a diagram illustrating a prior art slider parting process for separating a slider from a slider bar.

FIG. 2 is a diagram illustrating a prior art slider parting process for separating a slider from a slider bar. In the illustrated prior art slider parting process, a rotating blade 205 is made to move towards a slider bar 201 comprising a plurality of sliders 200 in a cutting direction 209. The slider bar 201 is affixed to a fixture (not shown) in such a way that an ABS side 210 of the slider bar 201 is parallel to the cutting direction 209. In another slider parting process, the slider bar 201 is affixed to the fixture in such a way that its ABS side is facing towards the cutting direction. In both cases, assuming that the surfaces of the original slider bar are initially flat, a parted slider can have negative camber, requiring a separate camber adjustment process (e.g., a relief cut process) performed after the slider parting process to generate positive camber.

It is therefore desirable to have an apparatus and method for controlling camber (e.g., generating a pre-determined positive camber) of a slider during a slider parting process without requiring a separate camber adjustment process before or after the slider parting operation.

SUMMARY OF THE INVENTION

Various embodiments of the subject disclosure address the aforementioned problems associated with prior art camber adjustment techniques by providing apparatuses and methods to manipulate stresses on slider sidewalls during a slider parting operation to combine camber adjustment with the slider parting process, thereby eliminating the need for a separate camber adjustment process.

According to one embodiment of the subject disclosure, a method of parting a slider from a slider bar is provided. The method can comprise receiving a slider bar comprising a plurality of sliders and having an air bearing surface (ABS) side and a back side opposite to the ABS side. The method can further comprise parting at least one slider from the slider bar with a cutter, wherein the cutter enters the slider bar at least in part on the backside and exits the slider bar at least in part on the ABS side.

According to one embodiment of the subject disclosure, an apparatus for parting a slider from a slider bar is provided. The apparatus can comprise a fixture for affixing a slider bar thereto, the slider bar comprising a plurality of sliders and having an air bearing surface (ABS) side and a back side opposite to the ABS side. The apparatus can comprise at least one cutter configured to part at least one slider from the slider bar, wherein the cutter is configured to enter the slider bar at least in part on the backside and to exit the slider bar at least in part on the ABS side.

It is to be understood that both the foregoing summary of the invention and the following detailed description are exemplary and explanatory and are intended to provide further explanation of the invention as claimed.

BRIEF DESCRIPTION OF THE DRAWINGS

The accompanying drawings, which are included to provide further understanding of the invention and are incorporated in and constitute a part of this specification, illustrate embodiments of the invention and together with the description serve to explain the principles of the invention.

DETAILED DESCRIPTION OF THE INVENTION

In the following detailed description, numerous specific details are set forth to provide a full understanding of the present invention. It will be apparent, however, to one ordinarily skilled in the art that the present invention may be practiced without some of these specific details. In other instances, well-known structures and techniques have not been shown in detail to avoid unnecessarily obscuring the present invention.

Figure 3:
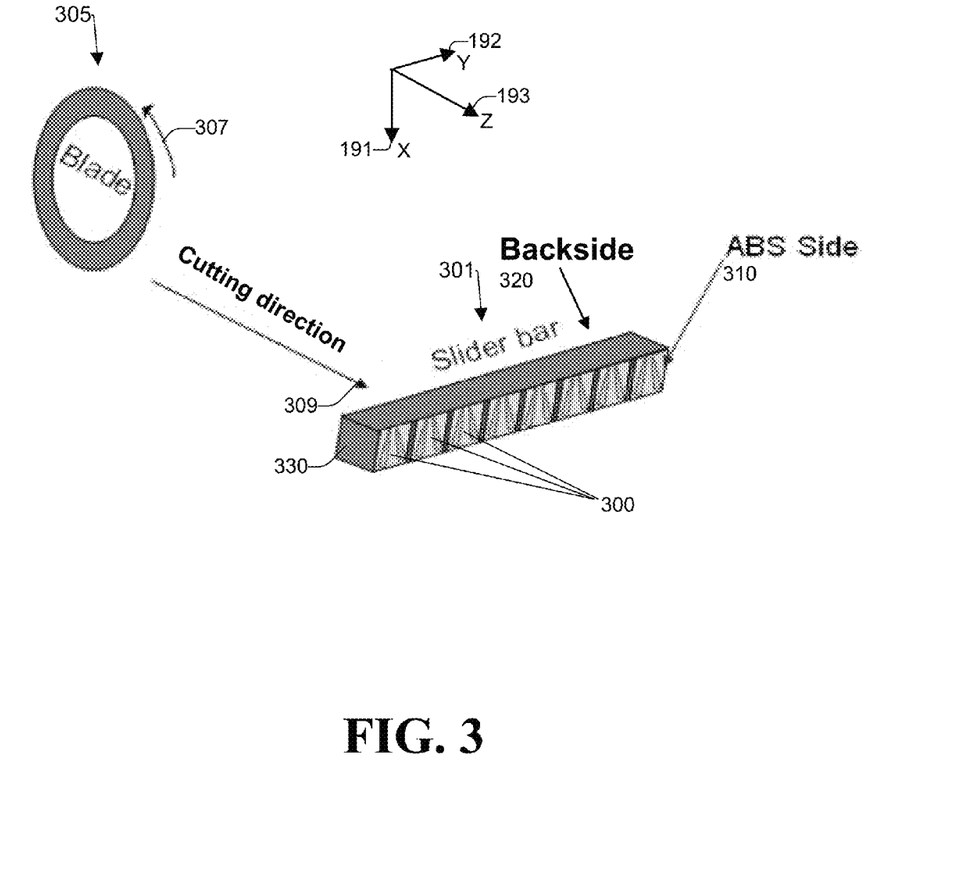
FIG. 3 is a diagram illustrating a slider parting process for separating a slider from a slider bar while inducing a stress on a sidewall of the slider according to one aspect of the subject disclosure.

FIG. 3 is a diagram illustrating a slider parting process for separating a slider from a slider bar while inducing a stress on a sidewall of the slider according to one aspect of the subject disclosure. In the illustrated slider parting process, a rotating blade 305 is made to move towards a slider bar 301 comprising a plurality of sliders 300 in a cutting direction 309 (e.g., z direction 193). The slider bar 301 is affixed to a fixture (not shown) in such a way that the slider bar 301 is disposed along a length direction (e.g., y direction 192) and an ABS side 310 of the slider bar 301 is perpendicular to the cutting direction 309 and facing away from the rotating blade 305. The slider bar 301 typically comprises a ceramic material such as $Al_2O_3$—TiC (known in the industry as Al—TiC).

In certain embodiments, the rotating blade 305 comprises a nickel-bonded diamond having diamond and nickel particle as abrasive materials. The rotating blade can have a thickness in a range of between about 25 and 200 micrometers (microns). In one embodiment, the rotating blade has a thickness of about 160 microns. The rotating blade 305 is rotating in a rotation direction 307 which in the illustrated embodiment is counterclockwise when viewed along the length direction (e.g., y direction 192). In certain embodiments, the rotating blade 305 rotates at a rotating speed in a range of about 3000 and 30,000 revolutions-per-second (rpm). In one embodiment, the rotating speed is about 9000 rpm. In some embodiments, the rotating blade 305 enters and travels through the slider bar 301 at a cutter feed rate in a range of about 0.01 and 1 millimeter per second (mm/sec). In one embodiment, the cutter feed rate is about 0.1 mm/sec.

In the slider-parting arrangement shown if FIG. 3, the rotating blade 305 enters the slider bar 301 on its backside 320 and exits the slider on the ABS side 310. Such an arrangement induces a compressive stress on side walls 330 of a slider during its parting (e.g., cutting) process. The compressive stress thus induced on the side walls generates positive camber on the ABS side of the parted slider, thereby eliminating the need for a separate camber adjustment process, such as a lapping operation before the slider-parting process or a relief-cut operation after the slider-parting process.

Figure 4:
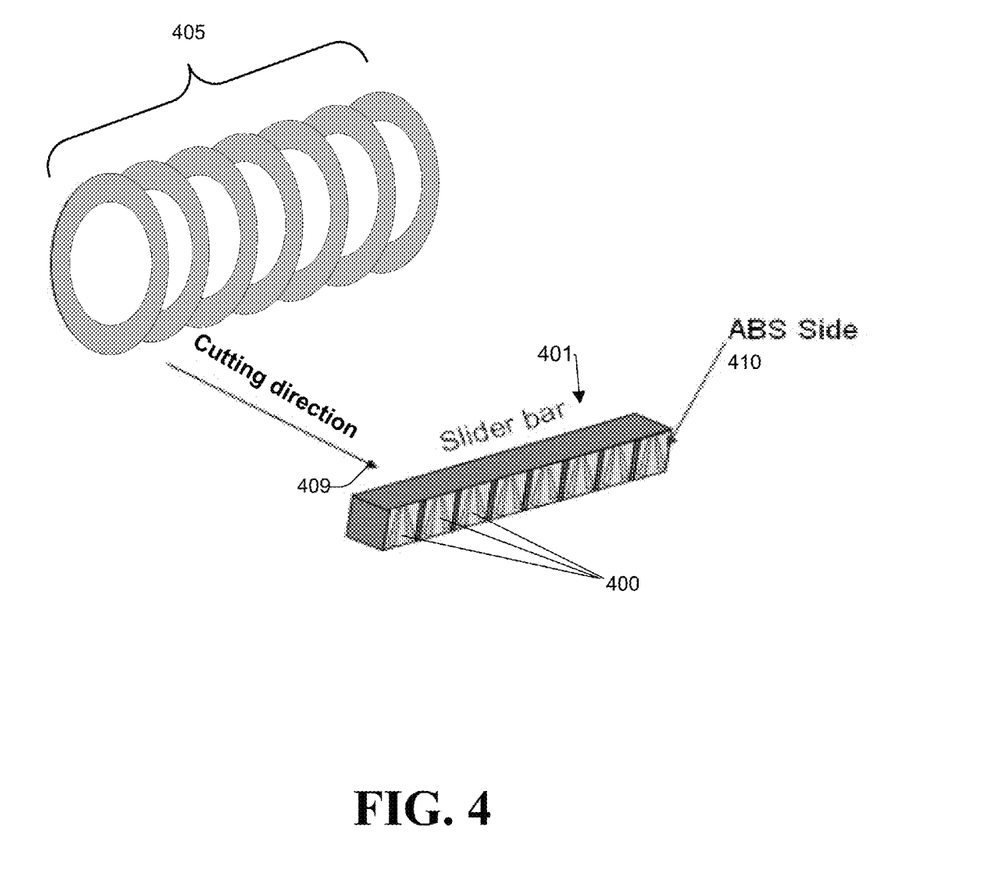
FIG. 4 is a diagram illustrating a slider parting process in which a plurality of parallelly-spaced rotating blades are employed to part multiple sliders of a slider bar at the same time according to one aspect of the subject disclosure.

It shall be appreciated by one skilled in the art that a multitude of modifications and/or additions to the slider parting process of FIG. 3 described above are possible without departing from the scope of the subject disclosure. For example, while the slider parting is achieved with a rotating blade 305 in the illustrated slider parting process of FIG. 3, other types of cutters such as a diamond wire saw moving in a specified direction (e.g., +x or −x direction) or oscillating in opposite directions (e.g., along+x and −x directions) may alternatively be used. While the rotating blade 305 is rotating in a counterclockwise direction when viewed along the length direction in the illustrated example of FIG. 3, the rotating blade 305 may be alternatively rotating in a clockwise direction instead. While only one cutter, namely the rotating blade 305, is shown in the illustrated example of FIG. 3, in an alternative slider parting process, a plurality of parallel cutters (e.g., rotating blades or cutting wires) may be employed. FIG. 4 is a diagram illustrating such a slider parting process in which a plurality ("gang") of parallelly-spaced rotating blades 405 are employed to part multiple sliders 400 of a slider bar 401 at the same time.

Figure 5:
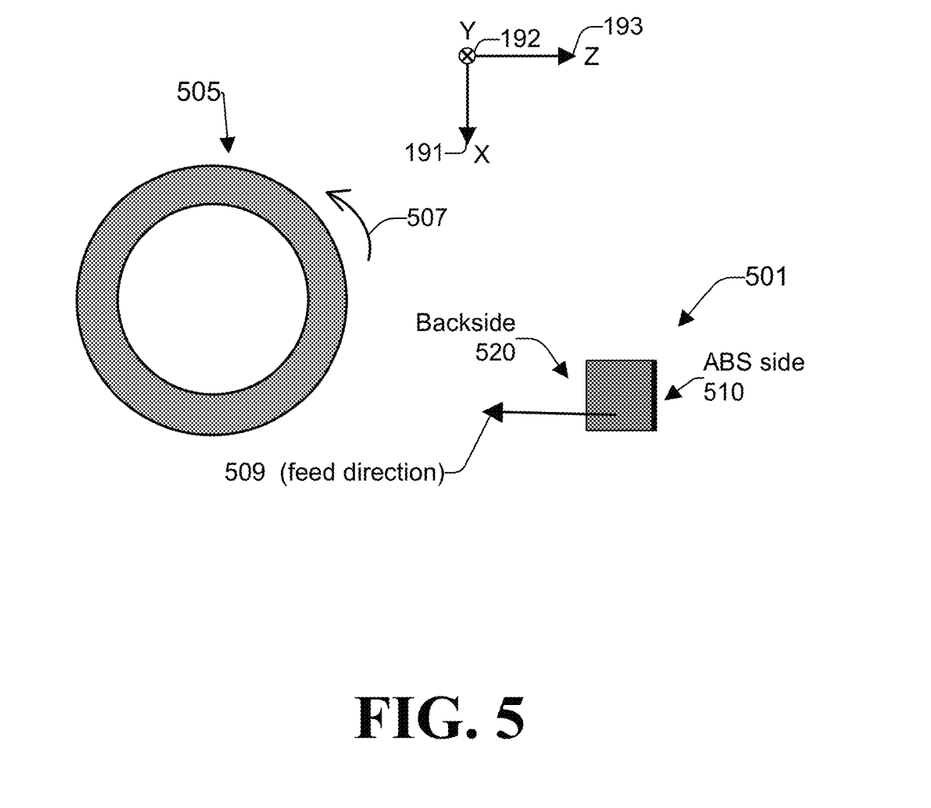
FIG. 5 is a diagram illustrating a slider parting process in which a slider bar moves towards a rotating blade in a feed direction according to one aspect of the subject disclosure.

While the cutter, namely the rotating blade 305, is shown in the illustrated example of FIG. 3 as moving towards the slider bar 301, in an alternative slider parting process, the slider bar 301 may move towards the cutter. FIG. 5 is a diagram illustrating such a slider parting process in which a slider bar 501 moves towards a rotating blade 505 in a feed direction 509 (e.g., −z direction). The slider bar 501 has an ABS side 510 and a backside 520. In the illustrated example, the backside 520 is perpendicular to the feed direction 509 and is facing towards the rotating blade 505 (e.g., −z direction). While the rotating blade 505 is shown as rotating in a counterclockwise rotating direction 507 when viewed along the y direction 192, the rotating blade 504 may alternatively be rotating in a clockwise direction.

Figure 6A:
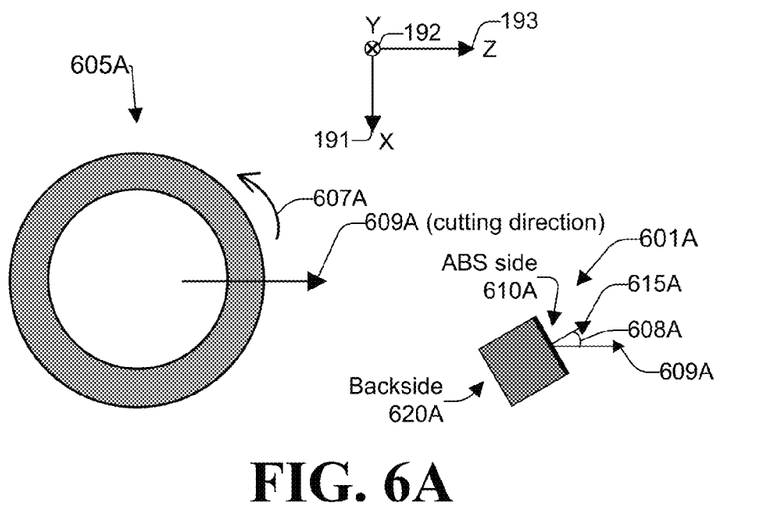
FIG. 6A is a diagram illustrating a slider parting process in which a rotating blade moves towards a slider bar in a cutting direction where the ABS side of the slider bar faces away from the cutting direction by a predetermined acute orientation angle according to one aspect of the subject disclosure.

As indicated above, the slider bars 301 and 401 illustrated in FIGS. 3 and 4 are oriented in such a way that their ABS sides 310, 410 are facing directly towards the cutting and feed directions 309, 409, respectively. However, in certain alternative slider parting processes in which the cutter moves towards the slider bar, the slider bar may be oriented in such a way that its ABS side is facing away from the cutting direction by an acute orientation angle. FIG. 6A is a diagram illustrating such a slider parting process in which a rotating blade 605A moves towards a slider bar 601A in a cutting direction 609A (e.g., z direction 193). The slider bar 601A has an ABS side 610A and a backside 620A, and the ABS side 610A faces away (as indicated by arrow 615A) from the cutting direction 609A by a predetermined acute orientation angle 608A.

The amount (degree) of the acute orientation angle 608A can be one of a plurality of cutting parameters to adjust or select to arrive at a set of optimum cutting parameters that produce a target ABS curvature profile (e.g., a target camber and/or a target crown) for the parted sliders. For example, for a given rotating speed and cutter feed rate, a stress induced on a sidewall of a slider by a parting process and hence positive camber induced on the ABS side of the slider are maximum when the ABS side 610A is facing directly towards the cutting direction 609A (e.g., when the orientation angle 608A is zero), and the induced stress and camber monotonically decreases as the ABS side 610A faces away from the cutting direction 609A (e.g., as the orientation angle 608A increases). Accordingly, camber (e.g., a camber delta change) of a parted slider may be controlled by adjusting the orientation angle 608A within 0 to 90 degrees.

Figure 6B:
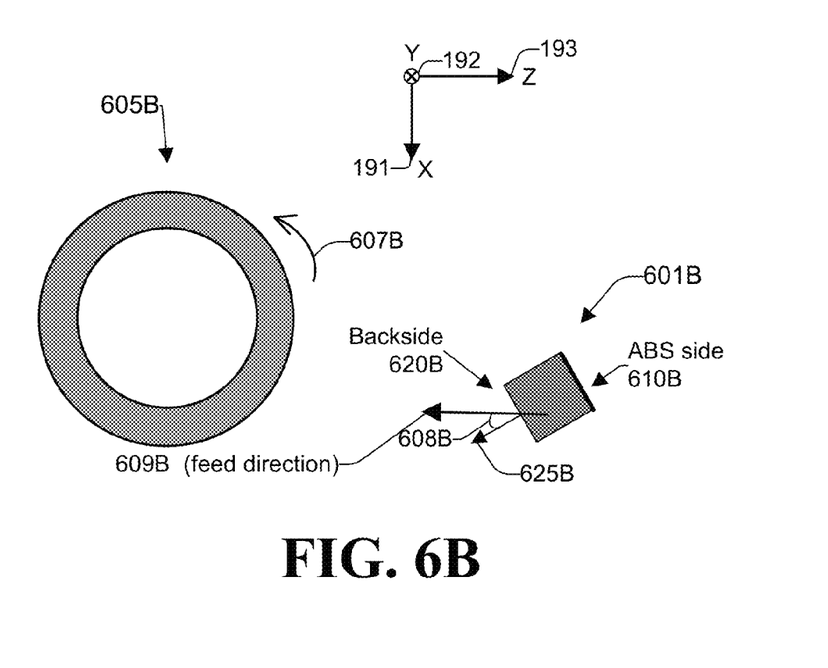
FIG. 6B is a diagram illustrating such a slider parting process in which a slider bar moves towards a rotating blade in a feed direction where the backside of the slider bar faces away from the feed direction by a predetermined acute orientation angle according to one aspect of the subject disclosure.

Similarly, the slider bar 501 illustrated in FIG. 5 is oriented in such a way that its backside 520 is facing directly towards the feed direction 509. However, in certain alternative slider parting processes in which the slider bar moves towards the cutter in a feed direction, the slider bar may be oriented in such a way that its back side is facing away from the feed direction by an acute orientation angle. FIG. 6B is a diagram illustrating such a slider parting process in which a slider bar 601B moves towards a rotating blade 605B in a feed direction 609B (e.g., –z direction). The slider bar 601B has an ABS side 610B and a backside 620B, and the backside 620B faces away (as indicated by arrow 625B) from the feed direction 609B by a predetermined acute orientation angle 608B. The amount (degree) of the acute orientation angle 608B can be one of a plurality of cutting parameters to adjust to determine a set of optimum cutting parameters that produce a target ABS curvature profile (e.g., a target camber and/or a target crown) for the parted sliders. For example, for a given cutter rotation direction and speed and feed rate, a stress induced on a sidewall of a slider by a parting process and hence positive camber induced on the ABS side of the slider are maximum when the backside 620B is facing directly towards the feed direction 609B (e.g., when the orientation angle 608B is zero), and the induced stress and camber monotonically decrease as the back side 620B faces away from the feed direction 609B (e.g., as the orientation angle 608B increases). Accordingly, camber (e.g., a camber delta change) of a parted slider may be controlled by adjusting the orientation angle 608B within 0 to 90 degrees.

Other cutting parameters that may also be adjusted or selected to arrive at a set of optimum cutting parameters that produce a target ABS curvature profile (e.g., a target camber and/or a target crown) for the parted sliders include, but are not limited to: rotation direction and speed of the rotating blade, a cutter feed rate of the rotating blade and/or a slider feed rate of the slider bar. Any one of the aforementioned cutting parameters can affect the ABS curvature profile via the mechanism of having an effect on a force (e.g., a resultant force that is a vector sum of a cutting force and a feed force) exerted on the slider during the parting process. The resultant force exerted on the slider in turn influences stresses induced on sidewalls of the slider, and the induced stresses affect the ABS curvature profile (e.g., camber and/or crown). For example, the slower the rotation speed, the greater the cutting force which results in a resultant force having different magnitude and direction than if a higher rotation speed were used.

Figure 7:
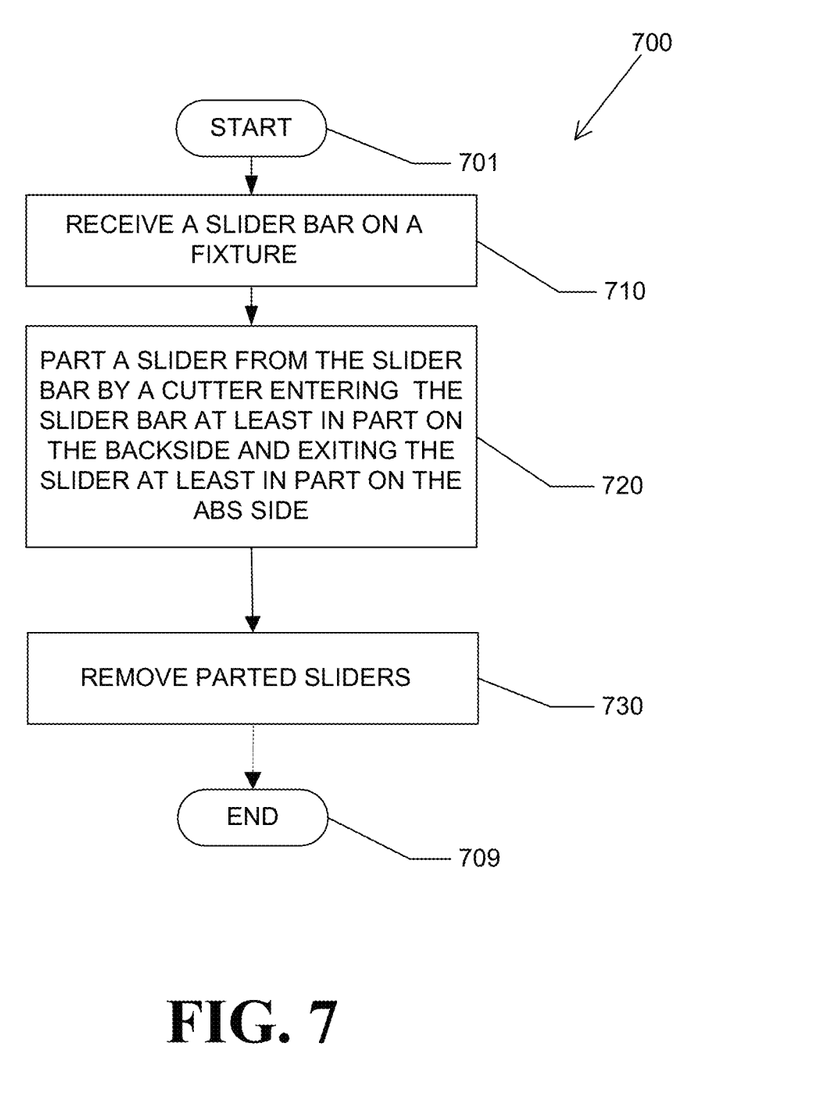
FIG. 7 is a flowchart illustrating an exemplary slider parting process for separating a slider from a slider bar while inducing a stress on a sidewall of the slider according to one aspect of the subject disclosure.
Figure 8A:
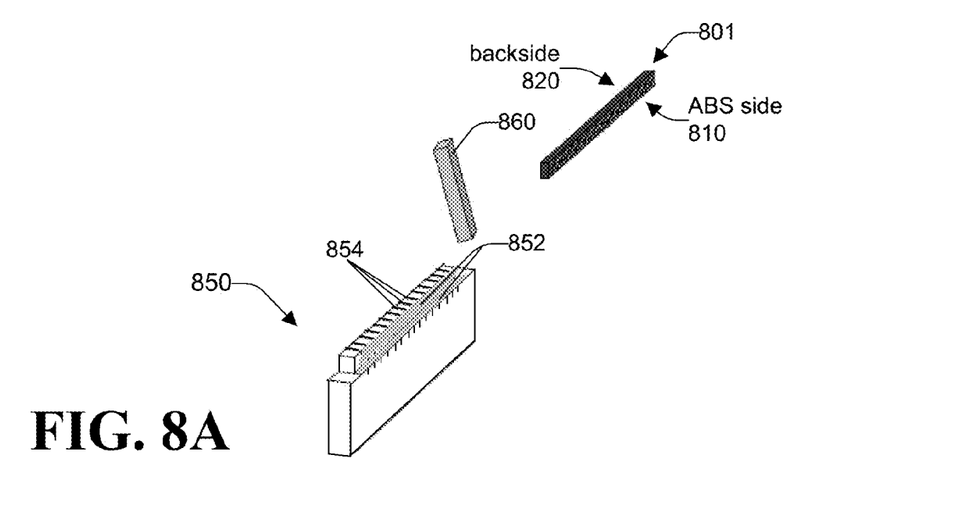
FIGS. 8A-C are diagrams illustrating various steps of the slider parting process of FIG. 7 according to one aspect of the subject disclosure.
Figure 8B:
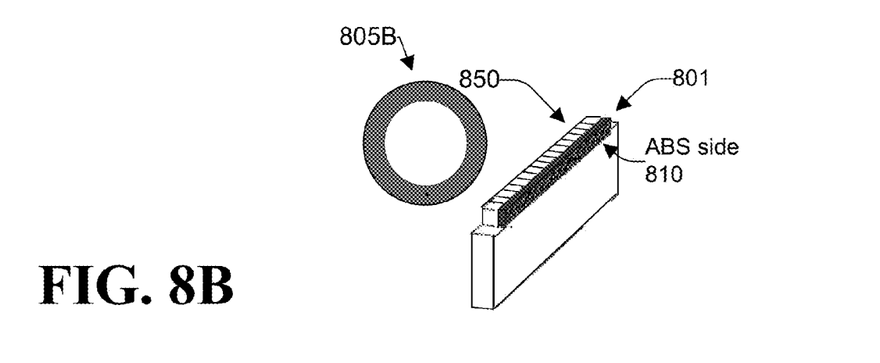
Figure 8C:
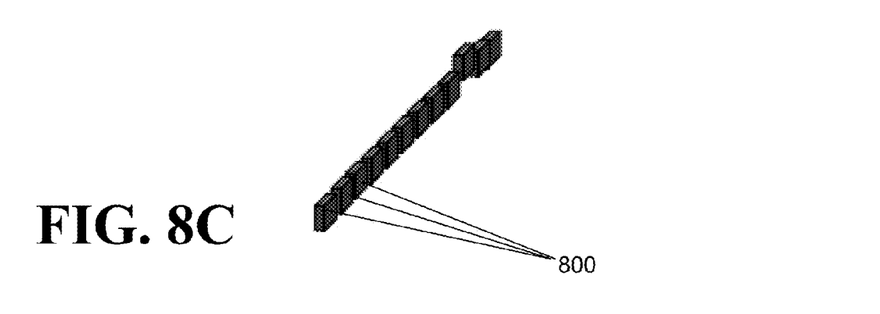

FIG. 7 is a flowchart illustrating an exemplary slider parting process 700 for separating a slider from a slider bar while inducing a stress on a sidewall of the slider according to one aspect of the subject disclosure. FIGS. 8A-C are diagrams illustrating various steps of the slider parting process 700 of FIG. 7.

The process 700 begins at start state 701 and proceeds to operation 710 in which a fixture such as fixture 850 of FIG. 8 receives a slider bar 801 having an ABS side 810 and a backside 820. A stick of glue 860 such as a thermal melt adhesive can be applied on one or more mounting surfaces 852 of the fixture 850 so that the slider bar 801 can be affixed to the fixture 850. In the illustrated example, the fixture 850 includes a plurality of parallelly-spaced slits 854 through which a rotating blade or a gang of parallelly-spaced rotating blades may travel during a slider parting operation.

The process 700 proceeds to operation 720 in which sliders 800 are parted from the slider bar by a cutter (e.g., a single cutter such as rotating blade 805B of FIG. 8B or multiple cutters such as parallelly-spaced rotating blades 405 of FIG. 4) entering the slider bar 801 at least in part on the backside 820 and exiting the slider bar 801 at least in part on the ABS side 810. In case of a single cutter, the cutter or the fixture can be mounted on an indexing table, and sliders can be parted serially. In certain embodiments, the fixture 850 is stationary and the rotating blade 805 or any other cutter employed moves towards the fixture 850 and the slider bar 801 in a cutting direction. In some of such embodiments, the ABS side 810 is facing directly along the cutting direction as seen in FIGS. 3-5. Alternatively, the ABS side 810 may be facing away from the cutting direction by a predetermined acute orientation angle as seen in FIG. 6A. In some embodiments, the fixture 850 moves towards the rotating blade 805 in a feed direction. In some such embodiments, the backside 820 is facing directly along the feed direction as seen in FIG. 5. Alternatively, the backside 820 may be facing away from the feed direction by a predetermined acute orientation angle as seen in FIG. 6B. In any case, a relative movement between the cutter 805 and the fixture 850 comes to an end after all individual sliders 800 in the slider bar 801 have been parted.

The process 700 proceeds to operation 730 in which the parted sliders 800 are removed from the fixture 850. In certain embodiments, the removal operation 730 includes applying heat to the fixture 850 so as to melt a thermal melt adhesive applied between the mounting surface 852 and the slider bar 801 at the operation 810. In other embodiments, the removal operation 730 includes a chemical to at least partially dissolve an adhesive applied between the mounting surface 852 and the slider bar 801. The process 700 terminates at end state 709.

Figure 9:
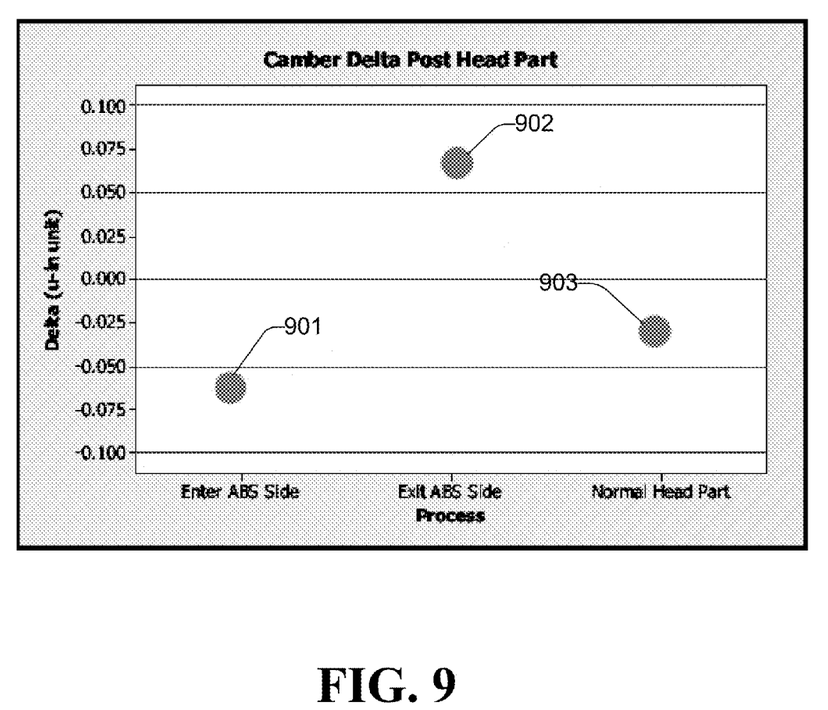
FIG. 9 is a graph showing three data points corresponding to camber delta changes associated with three different parting processes performed on slider bars having initially flat ABS and back sides according to one aspect of the subject disclosure.

FIG. 9 is a graph 900 showing three data points 901, 902, 903 corresponding to camber delta changes associated with three different parting processes performed on slider bars having initially flat ABS and back sides. The data point 901 corresponds to a camber delta change associated with a prior art slider parting process in which a rotating blade enters the slider bar on the ABS side and exits the slider bar on the backside. The data point 902 corresponds to a camber delta change associated with a slider parting process according to certain embodiments (e.g., those in FIGS. 3-5) of the subject disclosure in which a rotating blade enters the slider bar on the backside and exits the slider bar on the ABS side. The data point 903 corresponds to camber delta change associated with another prior art slider parting process such as seen in FIG. 2 in which a rotating blade enters the slider bar with the ABS side parallel to the cutting direction. The data points 901-903 of the graph 900 confirm that the parting process of the subject disclosure can generate a positive camber delta change (e.g., 0.067 micro inch (μ-in)) on a slider parted thereby. Meanwhile, the prior art parting processes generate undesirable negative camber delta changes (e.g., −0.062 μ-in and −0.03 μ-in) on sliders parted thereby.

In sum, various methods and apparatuses of the subject disclosure enable a control of ABS curvature profile (e.g., camber) on a parted slider by inducing a stress on a sidewall of the slider during a slider parting process. By optimizing a set of cutting parameters that affect the sidewall stress, a target ABS curvature profile (e.g., target camber and/or target crown) may be achieved via the slider parting process that employs the optimized set of cutting parameters, thereby eliminating the need for a separate adjustment process for the ABS curvature profile of interest.

The description of the invention is provided to enable any person skilled in the art to practice the various embodiments described herein. While the present invention has been particularly described with reference to the various figures and embodiments, it should be understood that these are for illustration purposes only and should not be taken as limiting the scope of the invention.

There may be many other ways to implement the invention. Various functions and elements described herein may be partitioned differently from those shown without departing from the spirit and scope of the invention. Various modifications to these embodiments will be readily apparent to those skilled in the art, and generic principles defined herein may be applied to other embodiments. Thus, many changes and modifications may be made to the invention, by one having ordinary skill in the art, without departing from the spirit and scope of the invention.

A reference to an element in the singular is not intended to mean "one and only one" unless specifically stated, but rather "one or more." The term "some" refers to one or more. Underlined and/or italicized headings and subheadings are used for convenience only, do not limit the invention, and are not referred to in connection with the interpretation of the description of the invention. All structural and functional equivalents to the elements of the various embodiments of the invention described throughout this disclosure that are known or later come to be known to those of ordinary skill in the art are expressly incorporated herein by reference and intended to be encompassed by the invention. Moreover, nothing disclosed herein is intended to be dedicated to the public regardless of whether such disclosure is explicitly recited in the above description.

What is claimed is:

1. A method of parting a slider from a slider bar, the method comprising:
    receiving the slider bar comprising a plurality of sliders and having an air bearing surface (ABS) side and a back side opposite to the ABS side;
    parting at least one slider from the slider bar with a cutter; and
    inducing a compressive stress on the slider, thereby generating a positive camber on the ABS side of the parted slider, and eliminating the need for a separate camber adjustment process;
    wherein the cutter enters the slider bar at least in part on the backside along a cutting direction and exits the slider bar at least in part on the ABS side and the ABS side is facing away from the cutting direction by a predetermined acute angle.

2. The method of claim 1, wherein the ABS side is perpendicular to the cutting direction and facing away from the cutter.

3. The method of claim 1, wherein the parting comprises parting multiple sliders simultaneously with a plurality of parallel cutters.

\* \* \* \* \*